United States Patent
Adachi et al.

(10) Patent No.: US 11,462,670 B2
(45) Date of Patent: Oct. 4, 2022

(54) THERMOELECTRIC CONVERSION MATERIAL, THERMOELECTRIC CONVERSION ELEMENT AND THERMOELECTRIC CONVERSION MODULE

(71) Applicants: Sumitomo Electric Industries, Ltd., Osaka (JP); Toyota School Foundation, Nagoya (JP)

(72) Inventors: Masahiro Adachi, Itami (JP); Makoto Kiyama, Itami (JP); Yoshiyuki Yamamoto, Itami (JP); Tsunehiro Takeuchi, Nagoya (JP)

(73) Assignees: Sumitomo Electric Industries, Ltd., Osaka (JP); Toyota School Foundation, Nagoya (JP)

( * ) Notice: Subject to any disclaimer, the term of this patent is extended or adjusted under 35 U.S.C. 154(b) by 650 days.

(21) Appl. No.: 16/328,300

(22) PCT Filed: Aug. 29, 2017

(86) PCT No.: PCT/JP2017/030903
§ 371 (c)(1),
(2) Date: Feb. 26, 2019

(87) PCT Pub. No.: WO2018/043478
PCT Pub. Date: Mar. 8, 2018

(65) Prior Publication Data
US 2019/0214538 A1   Jul. 11, 2019

(30) Foreign Application Priority Data

Aug. 31, 2016  (JP) .............................. JP2016-169406

(51) Int. Cl.
*H01L 35/14*   (2006.01)
*C01B 33/06*   (2006.01)
(Continued)

(52) U.S. Cl.
CPC ............ *H01L 35/14* (2013.01); *C01B 19/007* (2013.01); *C01B 33/06* (2013.01); *H01L 35/16* (2013.01);
(Continued)

(58) Field of Classification Search
CPC ....... H01L 35/14; H01L 35/16; C01B 19/007; C01B 33/06
See application file for complete search history.

(56) References Cited

PUBLICATIONS

Takagiwa et al., "Validity of rigid band approximation of PbTe thermoelectric materials", APL Materials 1, 011101 (2013). (Year: 2013).*

(Continued)

*Primary Examiner* — Tae-Sik Kang
(74) *Attorney, Agent, or Firm* — Faegre Drinker Biddle Reath LLP

(57) ABSTRACT

A thermoelectric conversion material includes: a base material that is a semiconductor; and an additive element that differs from an element constituting the base material. An additional band formed of the additive element is present within a forbidden band of the base material. A density of states of the additional band has a ratio of greater than or equal to 0.1 relative to a maximum value of a density of states of a valence band adjacent to the forbidden band of the base material.

15 Claims, 14 Drawing Sheets

(51) Int. Cl.
*C01B 19/00* (2006.01)
*H01L 35/16* (2006.01)
(52) U.S. Cl.
CPC ...... *C01P 2002/54* (2013.01); *C01P 2006/32* (2013.01); *C01P 2006/40* (2013.01)

(56) References Cited

PUBLICATIONS

Snyder et al., "Complex thermoelectric materials", Nature Materials, Vo. 7, Feb. 2008, 105-114. (Year: 2008).*
Kim et al., "Effects of Metal Doping on Thermoelectric Properties of Arc-Melted and Hot-Pressed b-Rhombohedral Boron", Materials Transactions, vol. 49, No. 3 (2008) pp. 593 to 599. (Year: 2008).*
Takiguchi et al., "Structural Properties of Heavily B-Doped SiGe Thin Films for High Thermoelectric Power", Materials Transactions, vol. 51, No. 5 (2010) pp. 878 to 881. (Year: 2010).*
L.D. Hicks, et al., "Effect of quantum-well structures on the thermoelectric figure of merit," Physical Review B, The American Physical Society, vol. 47, No. 19, 47(1993) 12 727-12 731.
L.D. Hicks, et al., "Experimental study of the effect of quantum-well structures on the thermoelectric figure of merit," Physical Review B, The American Physical Society, vol. 53, No. 16, 53(1996) R10 493-R10 496.
Takagiwa, Yoshiki, et al., "Validity of rigit band approximation of PbTe thermoelectric materials," APL Materials, 2013, vol. 1, p. 011101.

* cited by examiner

Densiy of states, $N(\varepsilon)$ / states $eV^{-1}$ cell$^{-1}$

Energy, $(\varepsilon-\varepsilon_F)$ / eV

Normalized spectral conductivity, $\sigma(\varepsilon)/\tau$

Energy, $(\varepsilon-\varepsilon_F)$ / eV

THERMOELECTRIC CONVERSION MATERIAL, THERMOELECTRIC CONVERSION ELEMENT AND THERMOELECTRIC CONVERSION MODULE

TECHNICAL FIELD

The present invention relates to a thermoelectric conversion material, a thermoelectric conversion element, and a thermoelectric conversion module. This application claims priority to Japanese Patent Application No. 2016-169406 filed on Aug. 31, 2016. The entire disclosure of this application is incorporated herein by reference

Background Art

In recent years, as clean energy replacing fossil fuels such as petroleum, renewable energy has attracted attention. The renewable energy includes, in addition to electric power generation using solar light, water power, and wind power, electric power generation by thermoelectric conversion using temperature difference. In thermoelectric conversion, since heat is directly converted to electricity, no extra waste is discharged during the conversion. Also, since thermoelectric conversion does not need a drive unit such as a motor, it has a feature that device maintenance is easy. In addition, an optical sensor such as an infrared sensor using thermoelectric conversion is available.

The conversion efficiency η of temperature difference (thermal energy) to electric energy using a material for conducting thermoelectric conversion (thermoelectric conversion material) is given by Equation (1) below.

$$\eta = \Delta T/T_h \cdot (M-1)/(M+T_c/T_h) \quad (1)$$

where $\eta$ is the conversion efficiency, $\Delta T = T_h - T_c$, $T_h$ is a temperature on the high-temperature side, $T_c$ is a temperature on the low-temperature side, $M=(1+ZT)^{1/2}$, $ZT=\alpha^2 ST/\kappa$, ZT is a dimensionless figure of merit, $\alpha$ is a Seebeck coefficient, S is an electric conductivity, $\kappa$ is a thermal conductivity. As above, the conversion efficiency is a monotonically increasing function of ZT. Increasing ZT is important in the development of thermoelectric conversion materials.

Many examinations have been made for the development of thermoelectric conversion materials, in which ZT is generally approximately 1. In contrast to this, a report has been made on a thermoelectric conversion material in which ZT has been increased using a quantum effect (e.g., see NPL 1 and NPL 2).

CITATION LIST

Non Patent Literature

NPL 1: L. D. Hicks et al., "Effect of quantum-well structures on the thermoelectric figure of merit," PHYSICAL REVIEW B, The American Physical Society, VOLUME 47, NUMBER 19, 47(1993) 12727

NPL 2: L. D. Hicks et al., "Experimental study of the effect of quantum-well structures on the thermoelectric figure of merit," PHYSICAL REVIEW B, The American Physical Society, VOLUME 53, NUMBER 16, 53(1996) R10493

SUMMARY OF INVENTION

The thermoelectric conversion material of the present disclosure includes a base material that is a semiconductor and an additive element that differs from an element constituting the base material. An additional band formed of the additive element is present within a forbidden band of the base material. A density of states of the additional band has a ratio of greater than or equal to 0.1 relative to a maximum value of a density of states of a valence band adjacent to the forbidden band of the base material.

DETAILED DESCRIPTION

Figure 1:
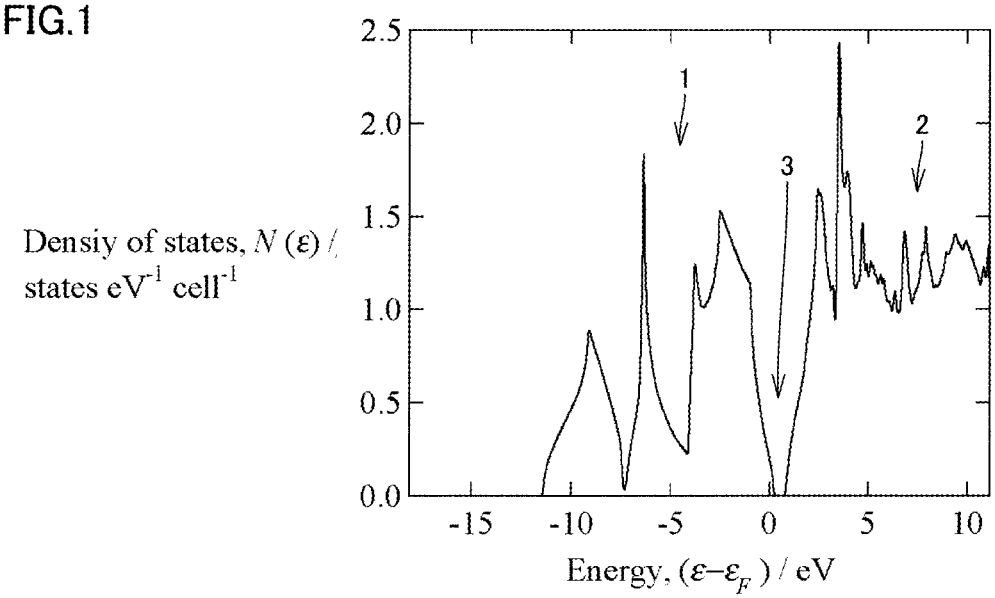
FIG. 1 is a view showing the band structure of a semiconductor material in terms of the density of states.

Problem to be Solved by the Present Disclosure

According to NPL 1 and NPL 2 described above, reduction in the dimension of carriers and increase in phonon scattering are obtained by the quantum effect, whereby the Seebeck coefficient and the thermal conductivity can be controlled.

However, the thermoelectric conversion materials reported in NPL 1 and NPL 2 above are meant to improve the density of states in the band by the quantum effect. Therefore, while the Seebeck coefficient rises, the electric conductivity does not rise so greatly. As a result, a problem has arisen that inductive noise becomes great.

In view of the above, an objective of the present disclosure is providing a thermoelectric conversion material capable of raising the electric conductivity thereby increasing the value of ZT.

Advantageous Effect of the Present Disclosure

According to the thermoelectric conversion material of the present disclosure, it is possible to provide a thermoelectric conversion material capable of raising the electric conductivity thereby increasing the value of ZT.

DESCRIPTION OF EMBODIMENTS

First, embodiments of the invention of this application will initially be listed and described. The thermoelectric conversion material in this application includes a base material that is a semiconductor and an additive element that differs from an element constituting the base material. An additional band formed of the additive element is present within the forbidden band of the base material. The density of states of the additional band has a ratio of greater than or equal to 0.1 relative to the maximum value of the density of states of a valence band adjacent to the forbidden band of the base material.

According to examinations by the present inventors, it is possible to widely raise the electric conductivity thereby increasing ZT, by adding an additive element to a base material that is a semiconductor so as to form, within the forbidden band of the base material, an additional band having a density of states great to some extent, specifically, a density of states having a ratio of greater than or equal to 0.1 relative to the maximum value of the density of states of the valence band adjacent to the forbidden band of the base material. In the thermoelectric conversion material in this application, there is present, in the forbidden band of the base material, an additional band that is formed of an additive element and has a density of states having a ratio of greater than or equal to 0.1 relative to the maximum value of the density of states of the valence band adjacent to the forbidden band of the base material. Therefore, according to the thermoelectric conversion material in this application, it is possible to provide a thermoelectric conversion material capable of raising the electric conductivity thereby increasing the value of ZT.

The electric conductivity of the above thermoelectric conversion material may be greater than or equal to 50 kS/m and less than or equal to 1.5 MS/m. With the electric conductivity of greater than or equal to 50 kS/m, high ZT can be easily achieved. With the electric conductivity of less than or equal to 1.5 MS/m, reduction in Seebeck coefficient and rise in thermal conductivity can be prevented or reduced.

In the above thermoelectric conversion material, the half bandwidth of the additional band may be less than or equal to 50 meV. With this, higher electric conductivity can be achieved and thus ZT can be easily raised widely.

In the above thermoelectric conversion material, the additive element may have an unoccupied orbital in d orbital or f orbital located inside the outermost shell. With this, it becomes easy to form an addition band small in energy width.

In the above thermoelectric conversion material, the additive element may be a transition metal. With this, it becomes easy to form an addition band small in energy width.

In the above thermoelectric conversion material, the additional band may lie in a region within 100 meV from the valence band or a conduction band of the base material. With this, it becomes easy to obtain high ZT when the temperature has risen.

In the above thermoelectric conversion material, the base material may be a silicon germanium (SiGe) based material. The SiGe-based material is suitable as the base material of the thermoelectric conversion material in this application. The SiGe-based material refers to a material of $Si_xGe_y$ ($0 \leq x$, $0 \leq y$, and $0 < x+y$) and a material in which part of at least one of Si and Ge of $Si_xGe_y$ has been replaced with carbon (C), tin (Sn), etc.

In the above thermoelectric conversion material, the additive element may be one kind or more selected from the group consisting of gold (Au), copper (Cu), nickel (Ni), and iron (Fe). All of Au, Cu, Ni, and Fe are suitable as the additive element when the base material is an SiGe-based material.

In the above thermoelectric conversion material, the base material may be a manganese silicon (MnSi) based material. The MnSi-based material is suitable as the base material of the thermoelectric conversion material in this application. The MnSi-based material refers to a material of $Mn_xSi_y$ ($0.90 \leq x \leq 1.10$ and $0.75 \leq y \leq 5.70$) and a material in which part of at least one of Mn and Si of $Mn_xSi_y$ has been replaced with aluminum (Al), tungsten (W), etc.

In the above thermoelectric conversion material, the additive element may be one kind or more selected from the group consisting of tantalum (Ta), tungsten (W), and rhenium (Re). Ta, W, and Re are suitable as the additive element when the base material is an MnSi-based material.

In the above thermoelectric conversion material, the base material may be an aluminum manganese silicon (AlMnSi) based material in which part of at least one of Mn and Si of the MnSi-based material has been replaced with Al. The AlMnSi-based material is suitable as the base material of the thermoelectric conversion material in this application. The AlMnSi-based material refers to a material of $Al_xMn_ySi_z$ ($0.00<x\leq3.67$, $0.90\leq y\leq1.10$, $1.50\leq x+z\leq5.70$, and $z\geq0.43x$) and a material in which part of at least one of Al, Mn and Si of $Al_xMn_ySi_z$ has been replaced with W, etc.

In the above thermoelectric conversion material, the additive element may be one kind or more selected from the group consisting of ruthenium (Ru), Ta, W, and Re. Ru, Ta, W, and Re are suitable as the additive element when the base material is an AlMnSi-based material.

In the above thermoelectric conversion material, the base material may be a tin selenium (SnSe) based material. The SnSe-based material is suitable as the base material of the thermoelectric conversion material in this application. The SnSe-based material refers to a material of $Sn_xSe_y$ ($0<x$, $0<y$, and $\tfrac{2}{3}\leq y/x\leq3/2$) and a material in which part of at least one of Sn and Se of $Sn_xSe_y$ has been replaced with scandium (Sc), titanium (Ti), zirconium (Zr), etc.

In the above thermoelectric conversion material, the additive element may be one kind or more selected from the group consisting of Sc, Ti, and Zr. Sc, Ti, and Zr are suitable as the additive element when the base material is an SnSe-based material.

In the above thermoelectric conversion material, the base material may be a copper selenium (CuSe) based material. The CuSe-based material is suitable as the base material of the thermoelectric conversion material in this application. The CuSe-based material refers to a material of $Cu_xSe_y$ ($0<x$, $0<y$, and $\tfrac{1}{4}\leq y/x\leq1$) and a material in which part of at least one of Cu and Se of $Cu_xSe_y$ has been replaced with Sc, Ti, vanadium (V), etc.

In the above thermoelectric conversion material, the additive element may be one kind or more selected from the group consisting of Sc, Ti, and V. Sc, Ti, and V are suitable as the additive element when the base material is a CuSe-based material.

The thermoelectric conversion element in this application includes: a thermoelectric conversion material section; a first electrode placed in contact with the thermoelectric conversion material section; and a second electrode placed in contact with the thermoelectric conversion material section but apart from the first electrode. The thermoelectric conversion material section is made of the thermoelectric conversion material in this application of which the ingredient composition has been adjusted to have p-type or n-type conductivity.

The thermoelectric conversion element in this application has the thermoelectric conversion material section made of the thermoelectric conversion material, excellent in thermoelectric conversion characteristics, of which the ingredient composition has been adjusted to have p-type or n-type conductivity. Therefore, according to the thermoelectric conversion element in this application, a thermoelectric conversion element excellent in conversion efficiency can be provided.

The thermoelectric conversion module in this application includes a plurality of such thermoelectric conversion elements. According to the thermoelectric conversion module in this application, by having a plurality of thermoelectric conversion elements excellent in thermoelectric conversion efficiency, a thermoelectric conversion module excellent in thermoelectric conversion efficiency can be obtained.

DETAILS OF EMBODIMENTS

Next, an embodiment of the thermoelectric conversion material according to the present invention will be described hereinafter with reference to the accompanying drawings.

Embodiment 1

Figure 2:
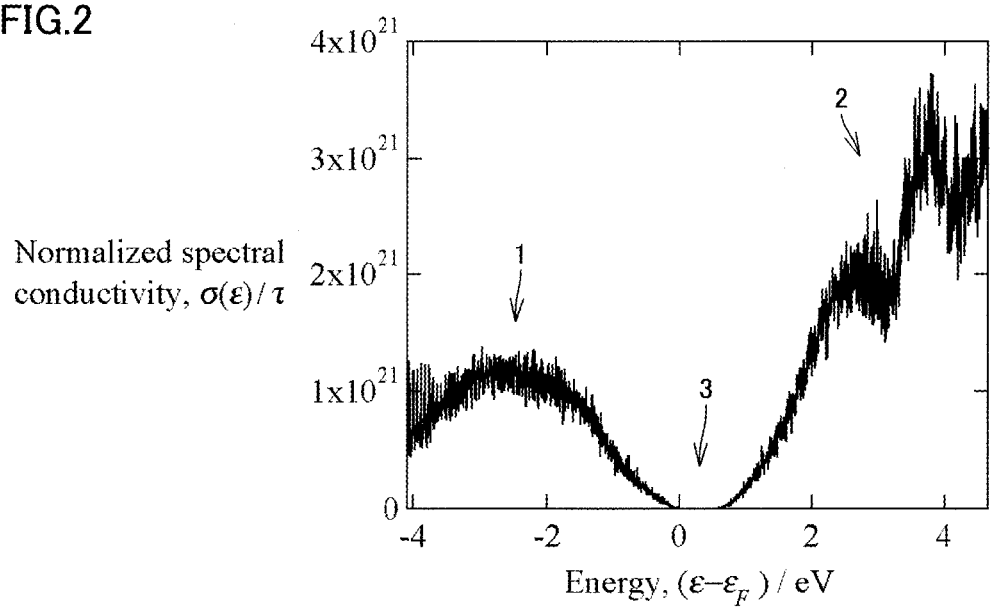
FIG. 2 is a view showing the band structure of a semiconductor material in terms of the spectral conductivity.

FIGS. 1 and 2 are views showing the band structure of silicon (Si) that is a semiconductor. In FIGS. 1 and 2, the horizontal axis represents the energy. The vertical axis represents the density of states in FIG. 1 and the spectral conductivity in FIG. 2. The spectral conductivity $\sigma(\varepsilon, T)$ is expressed by Equation (2) below.

$$\sigma(\varepsilon,T)=v^2(\varepsilon)\tau(\varepsilon)N(\varepsilon) \quad (2)$$

where $v$ is the heat speed of a carrier, $\tau$ is the relaxation time of the carrier, and N is the density of states. That is, the spectral conductivity is obtained by multiplying the density of states by the relaxation time of the carrier, etc., and is therefore proportional to the density of states. Referring to FIGS. 1 and 2, Si as a semiconductor has a forbidden band 3 between a valence band 1 and a conduction band 2.

Figure 3:
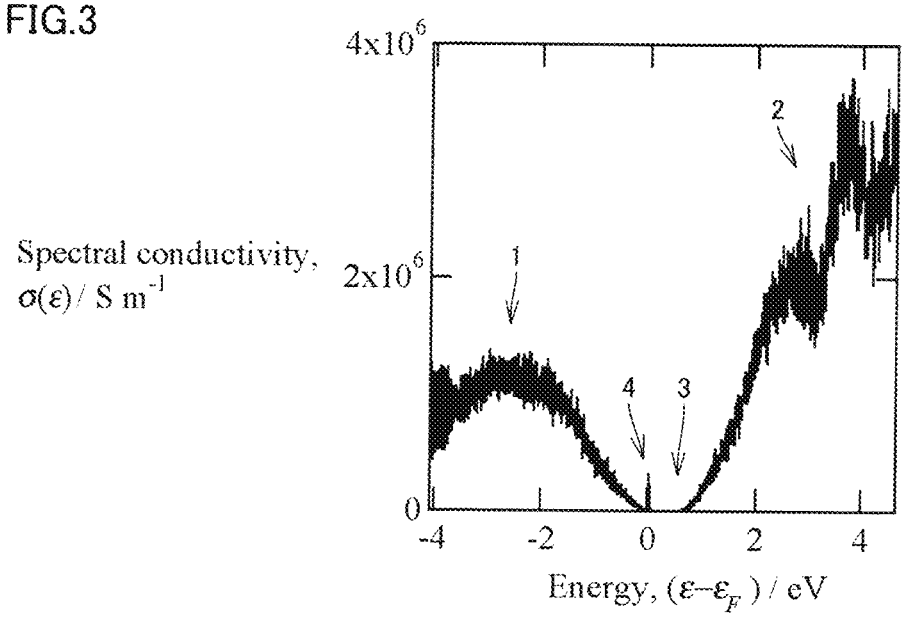
FIG. 3 is a view showing an example of the band structure of a semiconductor material in the case where an additional band is present within the forbidden band.
Figure 5:
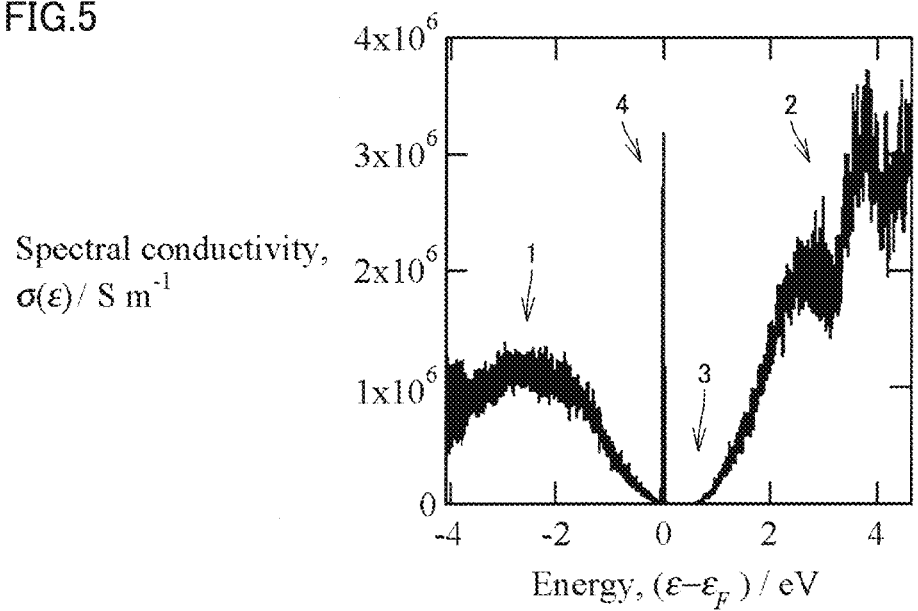
FIG. 5 is a view showing another example of the band structure of a semiconductor material in the case where an additional band is present within the forbidden band.
Figure 7:
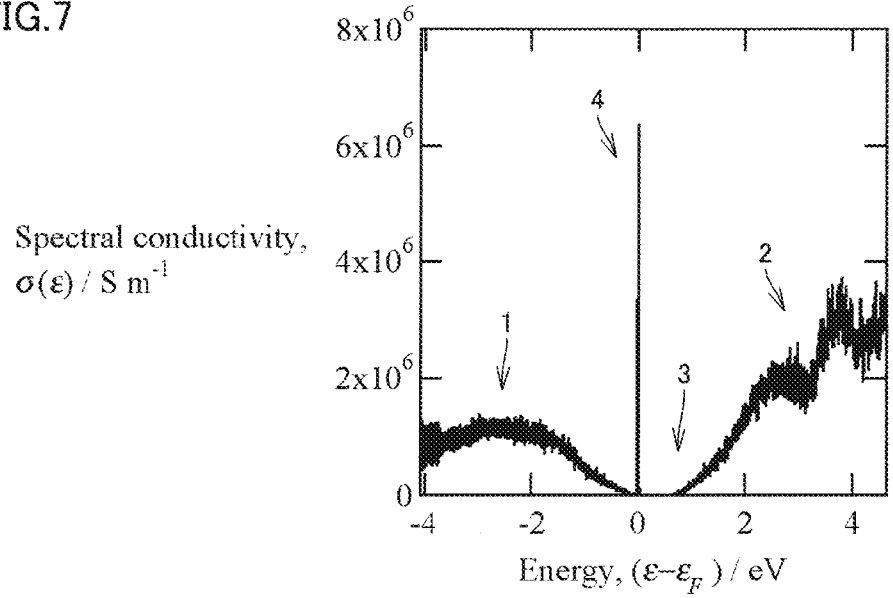
FIG. 7 is a view showing yet another example of the band structure of a semiconductor material in the case where an additional band is present within the forbidden band.

FIGS. 3, 5, and 7, corresponding to FIG. 2 described above, are views showing the band structure of the thermoelectric conversion material of this embodiment. Referring to FIGS. 3, 5, and 7, the thermoelectric conversion material of this embodiment includes a base material that is a semiconductor and an additive element that differs from an element constituting the base material. An additional band 4 formed of the additive element is present within forbidden band 3 lying between valence band 1 and conduction band 2 of the base material. The density of states of additional band 4 has a ratio of greater than or equal to 0.1 relative to the maximum value of the density of states of valence band 1 adjacent to forbidden band 3 of the base material.

Figure 4:
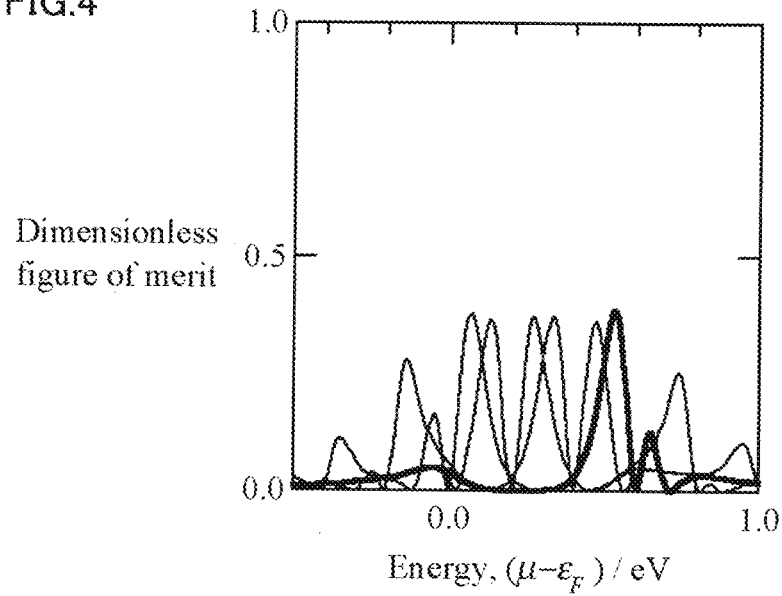
FIG. 4 is a view showing the calculation results of the value of ZT corresponding to the band structure in FIG. 3.
Figure 6:
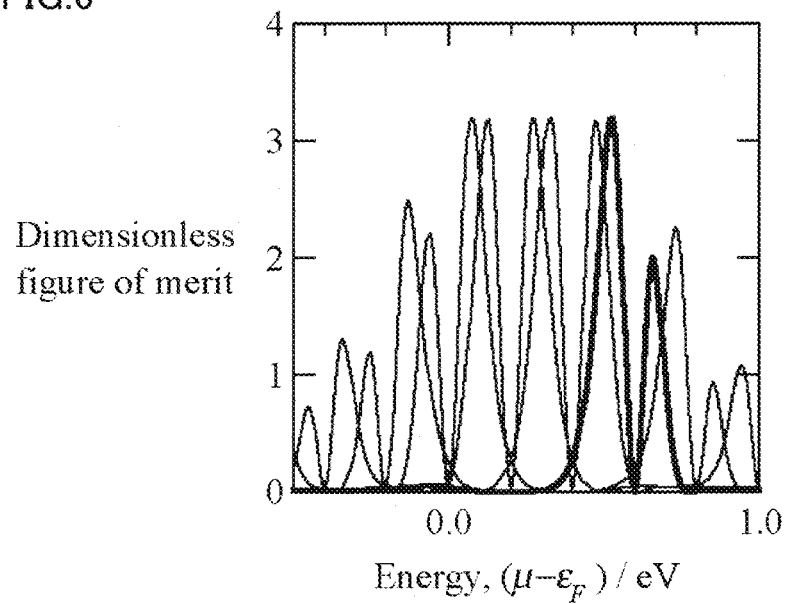
FIG. 6 is a view showing the calculation results of the value of ZT corresponding to the band structure in FIG. 5.
Figure 8:
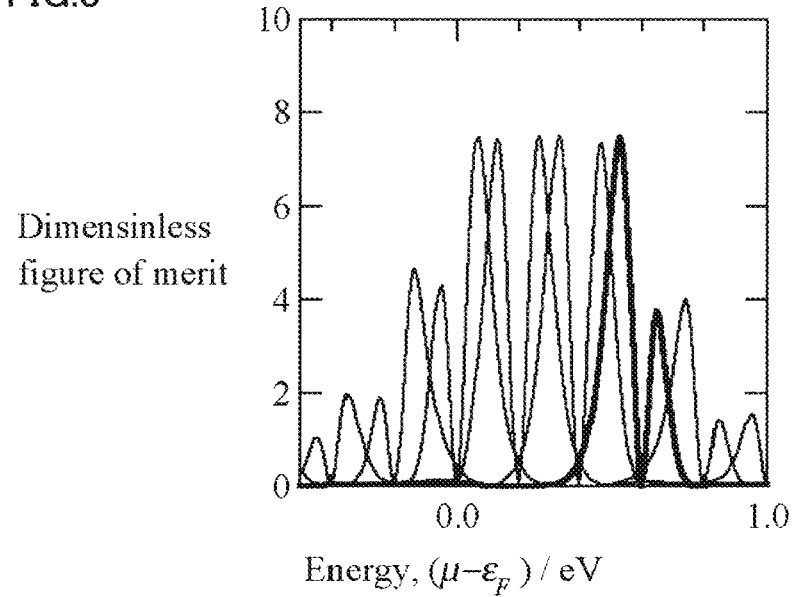
FIG. 8 is a view showing the calculation results of the value of ZT corresponding to the band structure in FIG. 7.

FIGS. 4, 6, and 8 are views showing the energy-ZT relationships calculated based on the band structures in FIGS. 3, 5, and 7, respectively. In FIGS. 4, 6, and 8, the horizontal axis represents the energy and the vertical axis represents ZT. ZT has been calculated assuming that additional band 4 follows the Gaussian distribution. Also, ZT has been calculated for a plurality of cases different in the formation position of additional band 4 in forbidden band 3. The plurality of curves in FIGS. 4, 6, and 8 correspond to the different formation positions of additional band 4.

Referring to FIG. 3, when the half bandwidth of additional band 4 is 20 meV and the strength of the spectral conductivity is $0.2\times10^6$ S/m, ZT is of the order of 0.4 as shown in FIG. 4. This value of ZT corresponds to the order of eight times as large as that when additional band 4 is not present.

Referring to FIG. 5, when the strength of the spectral conductivity is changed to $3.0\times10^6$ S/m, ZT becomes of the order of 3 as shown in FIG. 6. This value of ZT corresponds to the order of 60 times as large as that when additional band 4 is not present. Note that, as the lattice thermal conductivity, 0.5 W/mK is used. This value corresponds to a thermoelectric conversion material low in lattice thermal conductivity among usable thermoelectric conversion materials.

Referring to FIG. 7, when the half bandwidth of additional band 4 is changed to 10 meV, ZT becomes of the order of 8 as shown in FIG. 8. This value of ZT corresponds to the order of 180 times as large as that when additional band 4 is not present. At this time, compared with the case where additional band 4 is not present, the electric conductivity is 500 times, the Seebeck coefficient is 0.6 times, and the electron thermal conductivity is 16 times. That is, the rise of the electric conductivity greatly contributes to the rise of ZT in the thermoelectric conversion material of this embodiment.

Additional band 4 may just be present in forbidden band 3, but preferably lies in a region within 100 meV from valence band 1 or conduction band 2. With this, it becomes easy to obtain high ZT when the temperature rises. Further, it is especially preferable for additional band 4 to lie at the end of valence band 1 or conduction band 2 closer to forbidden band 3, that is, at either end of forbidden band 3. With this, ZT can be improved in high-temperature operation in a temperature range of approximately greater than or equal to 600 K.

The half bandwidth of additional band 4 is preferably less than or equal to 50 meV. Also, the density of states of additional band 4 preferably has a ratio of greater than or equal to 0.3 relative to the maximum value of the density of states of valence band 1 adjacent to forbidden band 3 of the base material. With this, it becomes easy to achieve higher electric conductivity thereby widely raising ZT.

Figure 9:
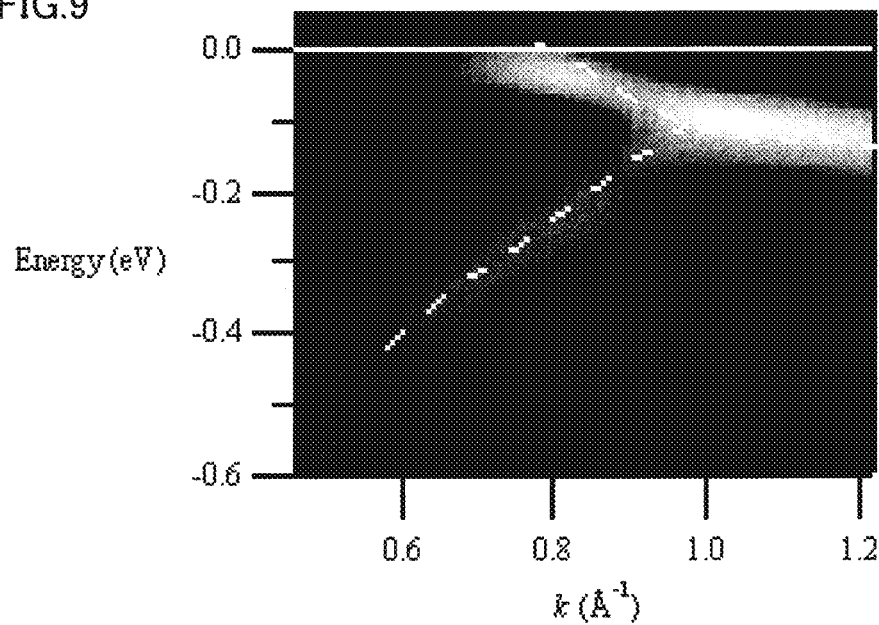
FIG. 9 is a view for illustrating a measurement method for an additional band using angle-resolved photoelectron spectroscopy.
Figure 10:
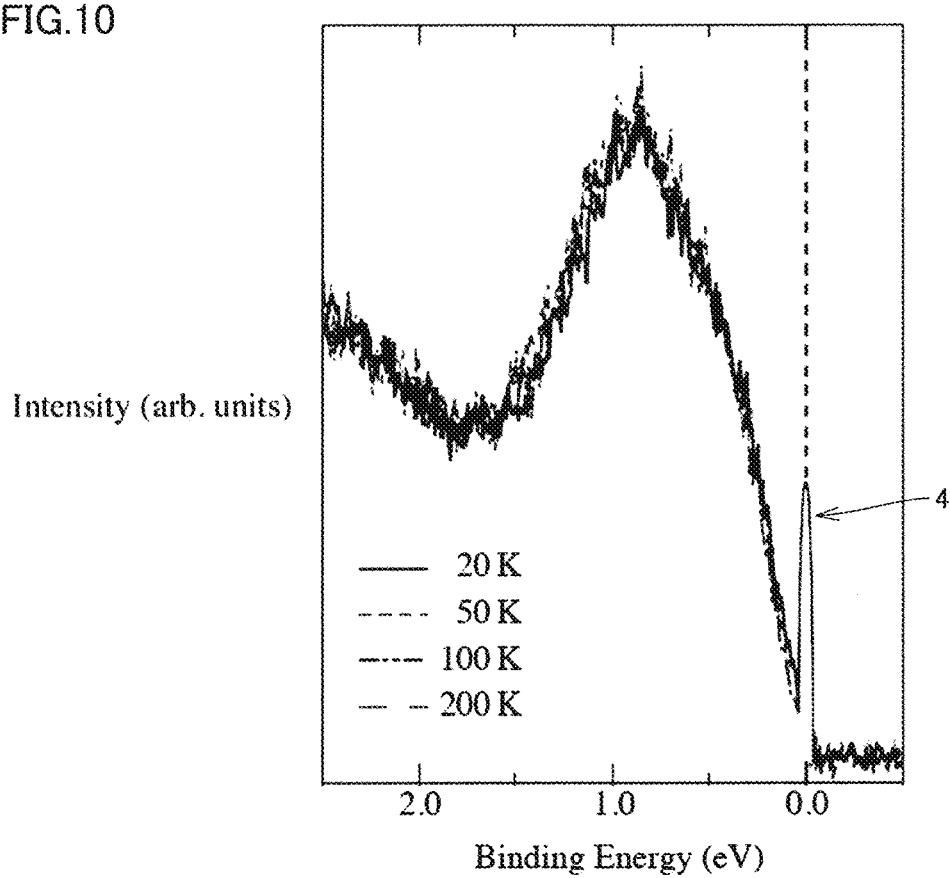
FIG. 10 is a view showing the relationship between binding energy and intensity corresponding to the density of states.

The presence of additional band 4 can be confirmed by angle-resolved photoelectron spectroscopy. FIG. 9 is a view showing an example of measurement results by the angle-resolved photoelectron spectroscopy. In FIG. 9, the horizontal axis represents the wavenumber, and the vertical axis represents the binding energy. FIG. 10 is a view showing the relationship between the binding energy and the intensity (arbitrary unit) corresponding to the density of states, obtained from the measurement results of FIG. 9. In FIG. 10, the horizontal axis represents the binding energy, and the vertical axis represents the intensity in arbitrary units corresponding to (proportional to) the density of states.

As shown in FIG. 9, an image corresponding to the density of states (a white image in FIG. 9) is obtained by the angle-resolved photoelectron spectroscopy. By analyzing the measurement results, the relationship between the binding energy and the intensity (arbitrary unit) corresponding to the density of states is obtained as shown in FIG. 10. When additional band 4 is present, an image corresponding to additional band 4 is obtained along a straight line drawn along the location corresponding to 0.0 of the vertical axis in FIG. 9. By analyzing this, a peak corresponding to additional band 4 shown in FIG. 10 is obtained. In this way, the presence of additional band 4 can be confirmed by the angle-resolved photoelectron spectroscopy. Also, by performing such analysis, the ratio of the density of states of additional band 4 relative to the maximum value of the density of states of valence band 1 of the base material can be calculated.

The electric conductivity of the thermoelectric conversion material of this embodiment is preferably greater than or equal to 50 kS/m and less than or equal to 1.5 MS/m. With the electric conductivity of greater than or equal to 50 kS/m, high ZT can be easily achieved. With the electric conductivity of less than or equal to 1.5 MS/m, reduction in Seebeck coefficient and rise in thermal conductivity can be prevented or reduced.

The additive element of the thermoelectric conversion material of this embodiment is preferably an element having an unoccupied orbital in d orbital or f orbital located inside the outermost shell, e.g., a transition metal. With this, it becomes easy to form an addition band small in energy width.

The thermoelectric conversion material of this embodiment can be produced by following the procedure of forming a thin film by molecular beam epitaxy (MBE) and then performing thermal treatment. Specifically, a thin film including a base material and an additive element, for example, is formed and thermal treatment is performed to produce a material including a mother phase and an additive element. By this thermal treatment, a crystalline body precipitated out of the mother phase and an aggregate of the additive element can be obtained. The crystalline body of the mother phase and the aggregate of the additive element have grain sizes of 0 to 50 nm. In particular, grain sizes of 3 to 15 nm are preferred because the phonon scattering becomes significant, decreasing the thermal conductivity to as small as less than or equal to 3 W/mK, and improving the thermoelectric characteristics ZT. The grain size of either one of the crystalline body and the aggregate is preferably less than or equal to 10 nm, more preferably less than or equal to 5 nm. Such a grain size is preferred because the thermal conductivity can be widely reduced.

(Thermoelectric Conversion Material Having SiGe-Based Material as Base Material)

In this embodiment, an SiGe-based material can be used as the base material. The SiGe-based material as used herein refers to a material of $Si_xGe_y$ ($0 \leq x$, $0 \leq y$, and $0 < x+y$) and a material in which part of at least one of Si and Ge of $Si_xGe_y$ has been replaced with C, Sn, etc. In this case, as the additive element, it is possible to use one kind or more selected from the group consisting of Au, Cu, Ni, and Fe. Specifically, the thermoelectric conversion material of this embodiment includes a mother phase constituted by an SiGe-based material and an additive element of one kind or more selected from the group consisting of Au, Cu, Ni, and Fe, for example. With this, a sharp band small in half bandwidth formed of the additive element can be formed within the forbidden band of the base material.

Figure 11:
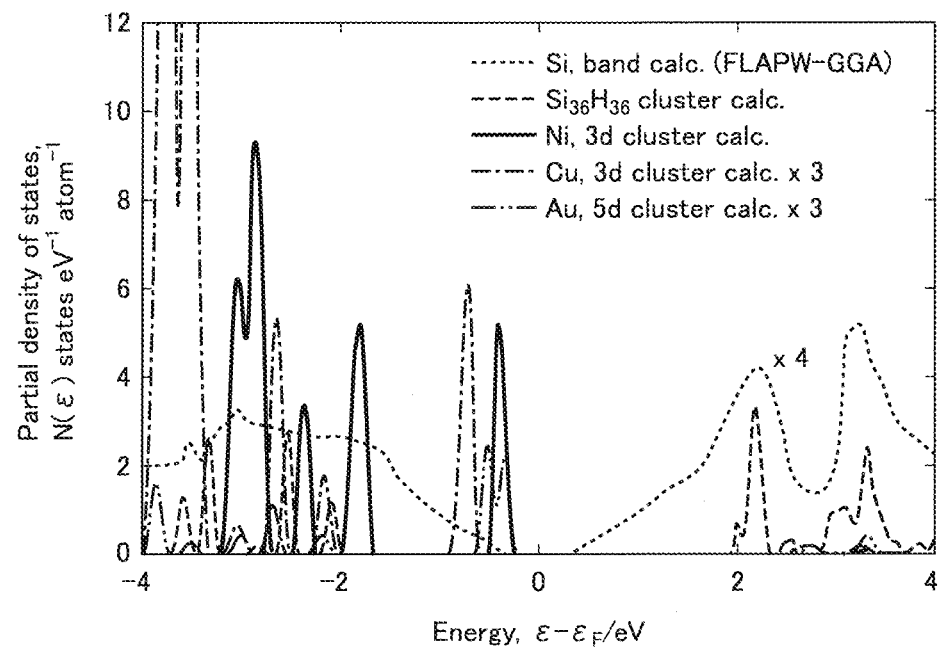
FIG. 11 is a view showing an example of the band structure in the case where an additional band of Au, Cu, or Ni as the additive element is present within the forbidden band of Si band in an SiGe-based material.
Figure 12:
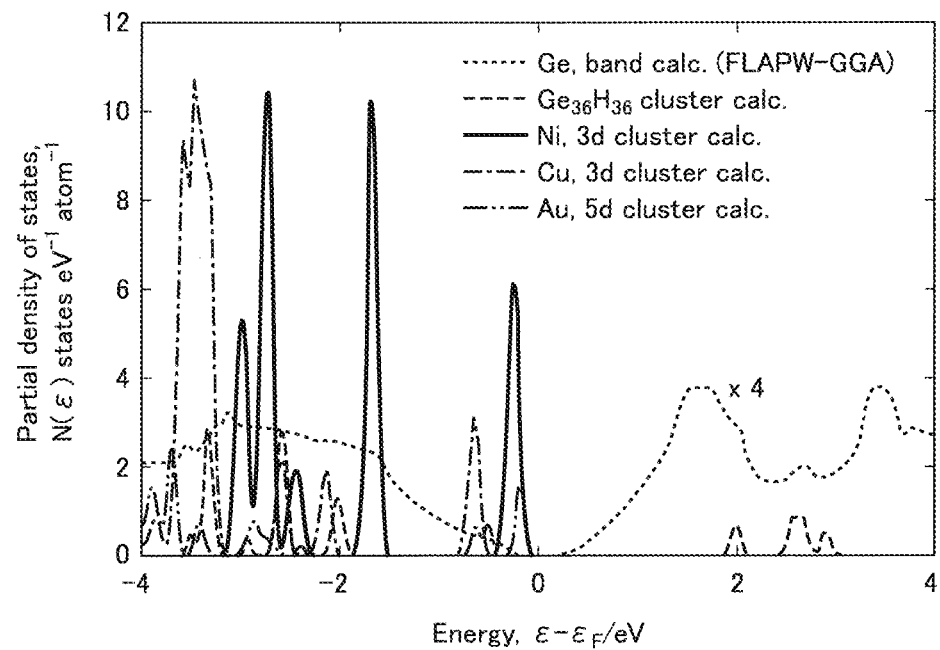
FIG. 12 is a view showing an example of the band structure in the case where an additional band of Au, Cu, or Ni as the additive element is present within the forbidden band of Ge band in an SiGe-based material.
Figure 13:
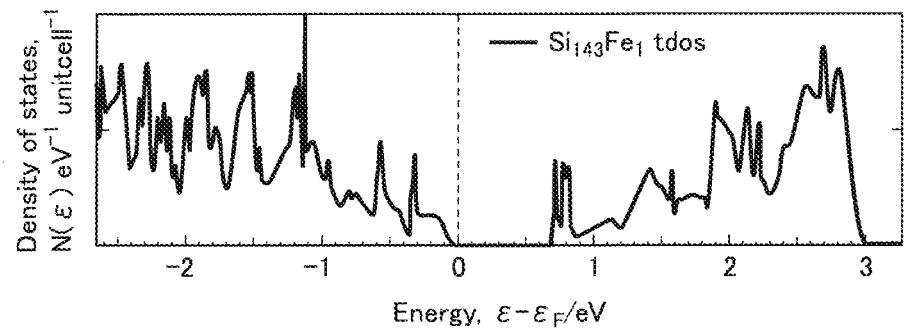
FIG. 13 is a view showing an example of the band structure in the case where an additional band of Fe as the additive element is present within the forbidden band of Si band in an SiGe-based material.

As for Si or Ge forming the SiGe-based material, FIG. 11 shows an example of the band structure in the case where an additional band of Au, Cu, or Ni as the additive element is present within the forbidden band of Si band, FIG. 12 shows an example of the band structure in the case where an additional band of Au, Cu, or Ni as the additive element is present within the forbidden band of Ge band, and FIG. 13 shows an example of the band structure in the case where an additional band of Fe as the additive element is present within the forbidden band of Si band. As shown in FIGS. 11 to 13, Au, Cu, Ni, and Fe as the additive elements can form sharp bands small in half bandwidth within the forbidden bands of Si and Ge. Also, by using a mother phase constituted by an SiGe-based material, addition bands narrow in half bandwidth can be formed at ends of the forbidden bands of the SiGe-based material.

Note that, in FIGS. 11 and 12, the Si and Ge bands are calculated by the full-potential linearized augmented plane wave (FLAPW) method, and the exchange interaction thereof is handled within the frame of the generalized gradient approximation (GGA) method. The bands of $Si_{36}H_{36}$ and $Ge_{36}H_{36}$ are cluster-calculated (i.e., calculated using a cluster model, or calculated by DV-Xα method, which also applies to similar cases). The bands of the 5d orbital of Au, the 3d orbital of Cu, and the 3d orbital of Ni are cluster-calculated. In FIG. 13, the bands of Si and Fe in $Si_{143}Fe_1$ are shown by the total density of states (tdos). The "×3" in the notes for the 3d orbital of Cu and the 5d orbital of Au and "×4" at the peak of the Si band in FIG. 11 indicate that the represented signals have been "tripled" and "quadrupled," respectively.

(Thermoelectric Conversion Material Having MnSi-Based Material as Base Material)

In this embodiment, an MnSi-based material can be used as the base material. The MnSi-based material as used herein refers to a material of $Mn_xSi_y$ ($0.90 \leq x \leq 1.10$ and $0.75 \leq y \leq 5.70$) and a material in which part of at least one of Mn and Si of $Mn_xSi_y$ has been replaced with Al, W, etc. In this case, as the additive element, it is possible to use one kind or more selected from the group consisting of Ta, W, and Re. Specifically, the thermoelectric conversion material of this embodiment includes a mother phase constituted by an MnSi-based material and an additive element of one kind or more selected from the group consisting of Ta, W, and Re, for example. With this, a sharp band small in half bandwidth formed of the additive element can be formed within the forbidden band of the base material.

Figure 14:
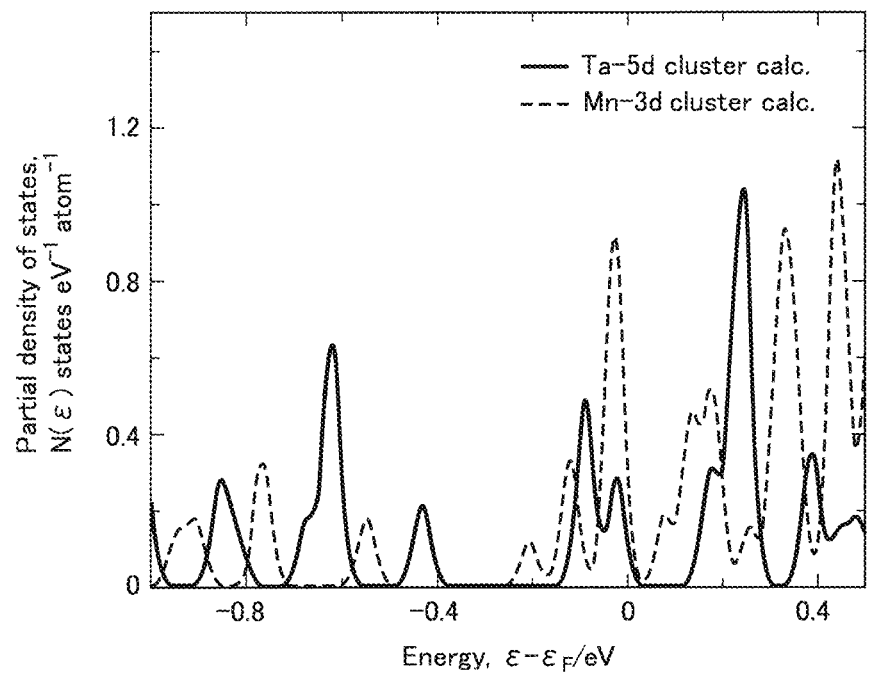
FIG. 14 is a view showing an example of the band structure in the case where an additional band of Ta as the additive element is present within the forbidden band of Mn band in an MnSi-based material.
Figure 15:
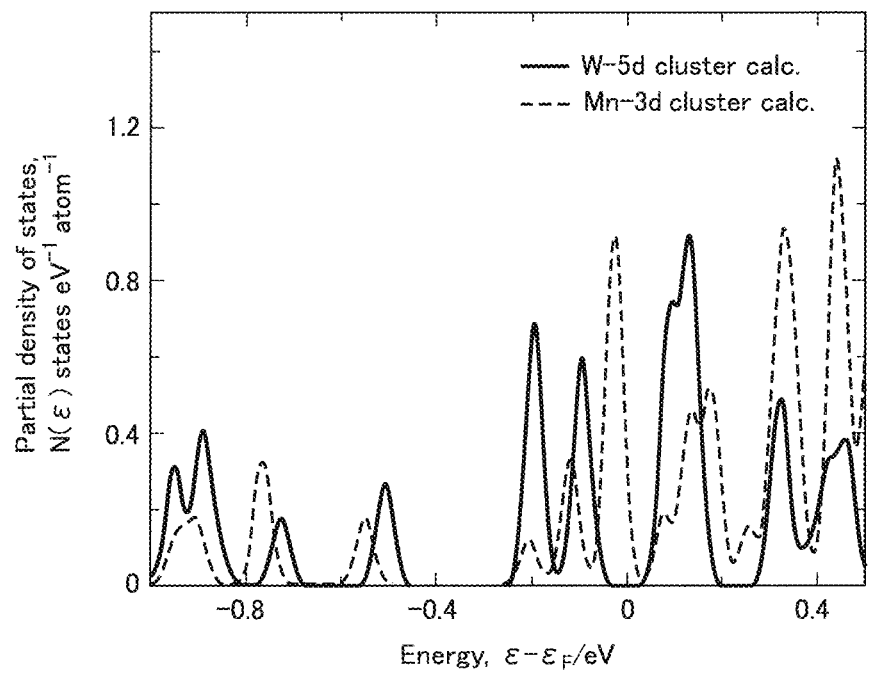
FIG. 15 is a view showing an example of the band structure in the case where an additional band of W as the additive element is present within the forbidden band of Mn band in an MnSi-based material.
Figure 16:
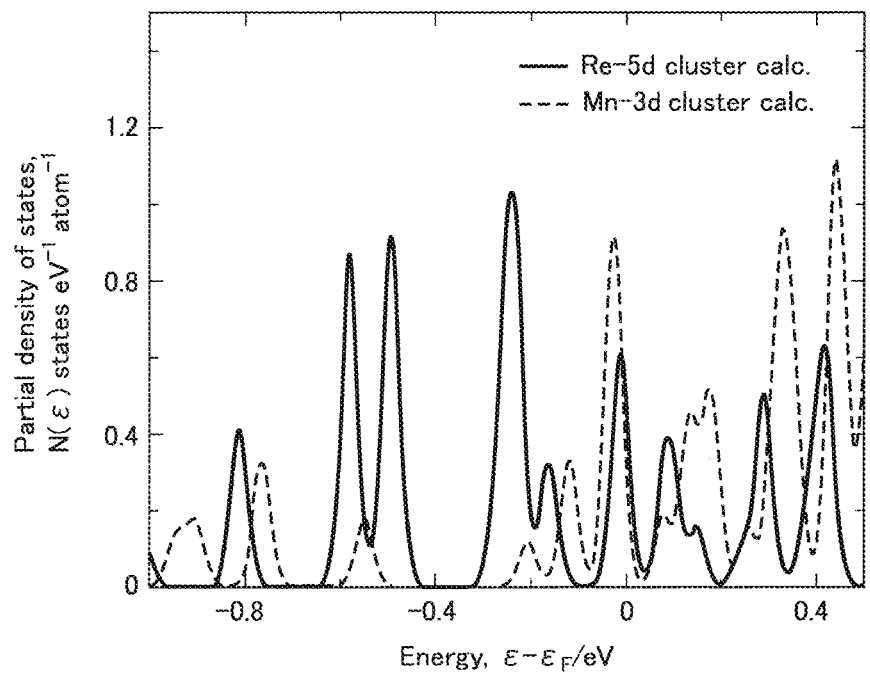
FIG. 16 is a view showing an example of the band structure in the case where an additional band of Re as the additive element is present within the forbidden band of Mn band in an MnSi-based material.

As for $Mn_1Si_{1.73}$ as the MnSi-based material, FIG. 14 shows an example of the band structure in the case where an additional band of Ta as the additive element is present within the forbidden band of Mn band, FIG. 15 shows an example of the band structure in the case where an additional band of W as the additive element is present within the forbidden band of Mn band, and FIG. 16 shows an example of the band structure in the case where an additional band of Re as the additive element is present within the forbidden band of Mn band. As shown in FIGS. 14 to 16, Ta, W, and Re as the additive elements can form sharp bands small in half bandwidth within the forbidden band of Mn band. Also, by using a mother phase constituted by an MnSi-based material, addition bands narrow in half bandwidth can be formed at ends of the forbidden bands of the MnSi-based material.

Note that, in FIGS. 14 to 16, the bands of the 3d orbital of Mn, the 5d orbital of Ta, the 5d orbital of W, and the 5d orbital of Re are cluster-calculated.

(Thermoelectric Conversion Material Having AlMnSi-Based Material as Base Material)

In this embodiment, an AlMnSi-based material in which part of at least one of Mn and Si of the MnSi-based material described above has been replaced with Al can be used as the base material. The AlMnSi-based material as used herein refers to a material of $Al_xMn_ySi_z$ ($0.00 < x \leq 3.67$, $0.90 \leq y \leq 1.10$, $1.50 \leq x+z \leq 5.70$, and $z \geq 0.43x$) and a material in which part of at least one of Al, Mn and Si of $Al_xMn_ySi_z$ has been replaced with W, etc. In this case, as the additive element, it is possible to use one kind or more selected from the group consisting of Ru, Ta, W, and Re. Specifically, the thermoelectric conversion material of this embodiment includes a mother phase constituted by an AlMnSi-based material and an additive element of one kind or more selected from the group consisting of Ru, Ta, W, and Re, for example. With this, a sharp band small in half bandwidth formed of the additive element can be formed within the forbidden band of the base material.

Figure 17:
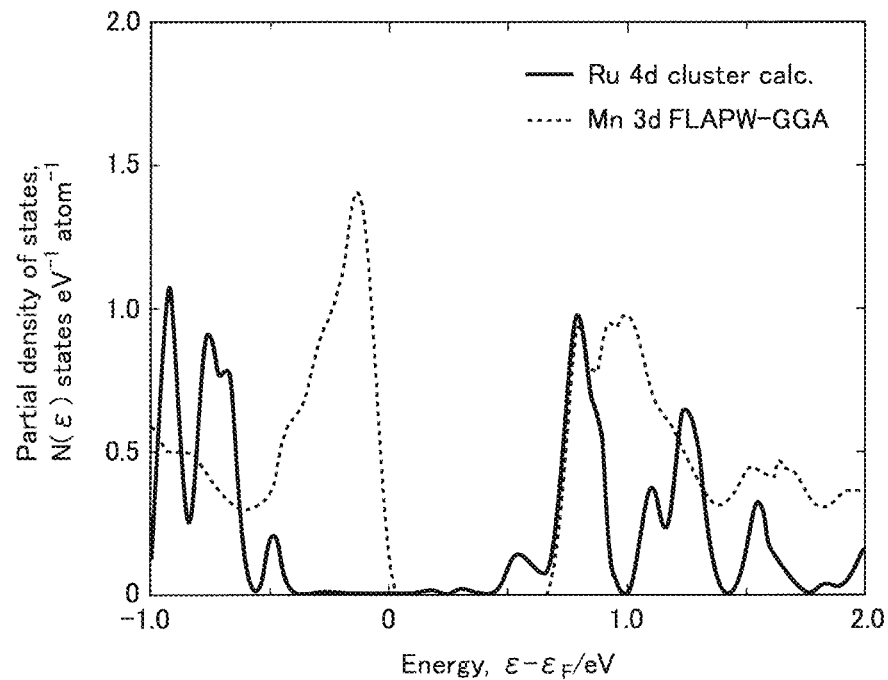
FIG. 17 is a view showing an example of the band structure in the case where an additional band of Ru as the additive element is present within the forbidden band of Mn band in an AlMnSi-based material.
Figure 18:
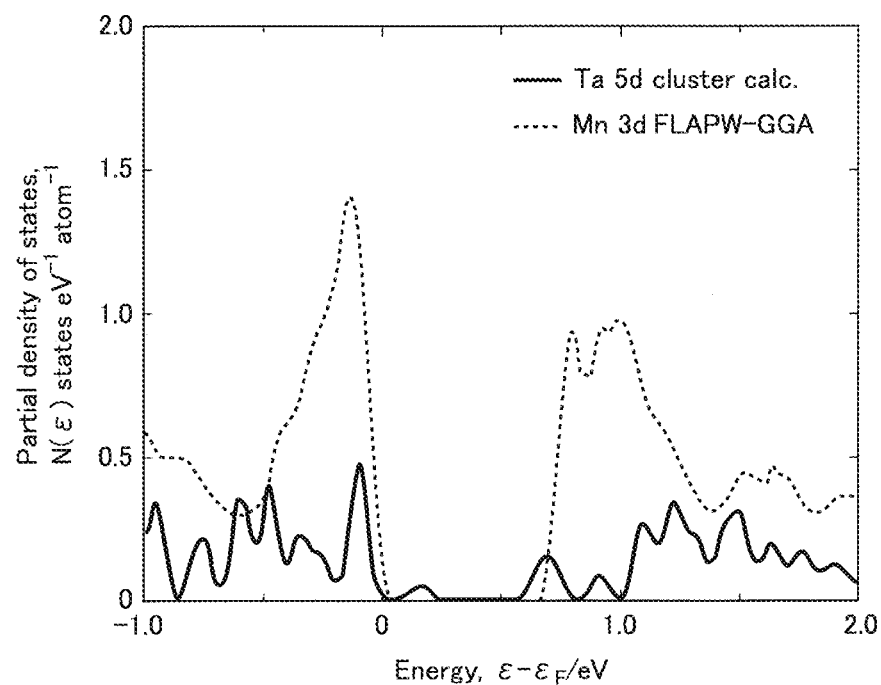
FIG. 18 is a view showing an example of the band structure in the case where an additional band of Ta as the additive element is present within the forbidden band of Mn band in an AlMnSi-based material.
Figure 19:
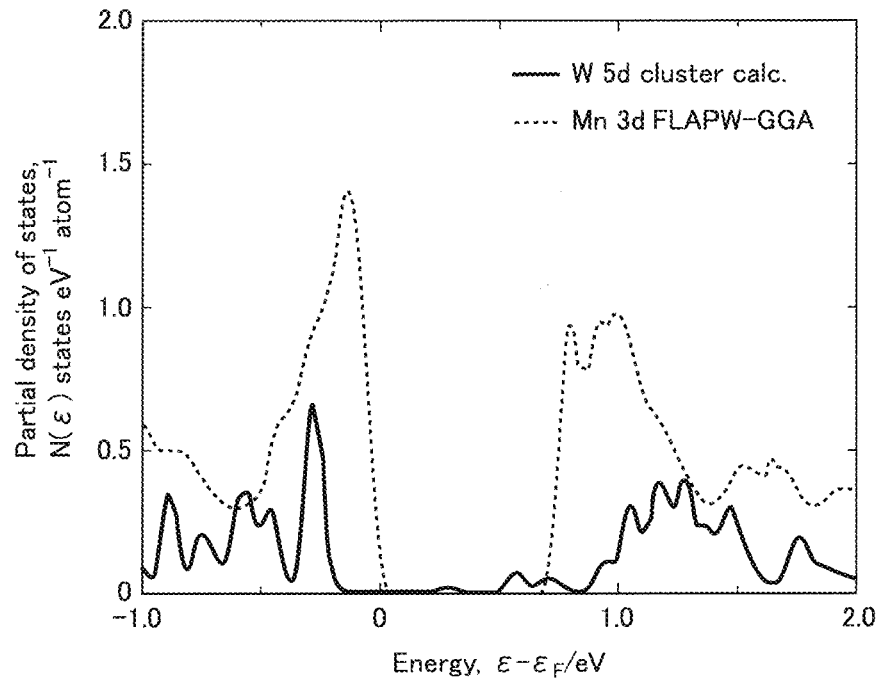
FIG. 19 is a view showing an example of the band structure in the case where an additional band of W as the additive element is present within the forbidden band of Mn band in an AlMnSi-based material.
Figure 20:
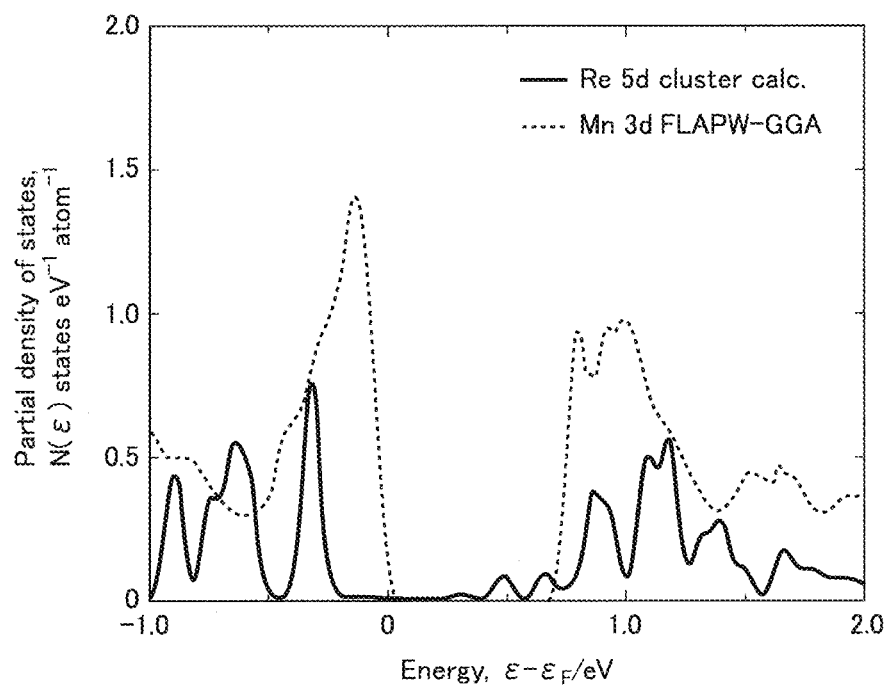
FIG. 20 is a view showing an example of the band structure in the case where an additional band of Re as the additive element is present within the forbidden band of Mn band in an AlMnSi-based material.

As for $Al_1Mn_1Si_1$ as the AlMnSi-based material, FIG. 17 shows an example of the band structure in the case where an additional band of Ru as the additive element is present within the forbidden band of Mn band, FIG. 18 shows an example of the band structure in the case where an additional band of Ta as the additive element is present within the forbidden band of Mn band, FIG. 19 shows an example of the band structure in the case where an additional band of W as the additive element is present within the forbidden band of Mn band, and FIG. 20 shows an example of the band structure in the case where an additional band of Re as the additive element is present within the forbidden band of Mn band. As shown in FIGS. 17 to 20, Ru Ta, W, and Re as the additive elements can form sharp bands small in half bandwidth within the forbidden band of Mn band. Also, by using a mother phase constituted by an AlMnSi-based material, addition bands narrow in half bandwidth can be formed at ends of the forbidden bands of the AlMnSi-based material.

Note that, in FIGS. 17 to 20, the band of the 3d orbital of Mn is calculated by the FLAPW method and the GGA method described above. The bands of the 4d orbital of Ru, the 5d orbital of Ta, the 5d orbital of W, and the 5d orbital of Re are cluster-calculated.

(Thermoelectric Conversion Material Having SnSe-Based Material as Base Material)

In this embodiment, an SnSe-based material can be used as the base material. The SnSe-based material as used herein refers to a material of $Sn_xSe_y$ ($0 < x$, $0 < y$, and $2/3 \leq y/x \leq 3/2$) and a material in which part of at least one of Sn and Se of $Sn_xSe_y$ has been replaced with Sc, Ti, Zr, etc. In this case, as the additive element, it is possible to use one kind or more selected from the group consisting of Sc, Ti, and Zr.

Specifically, the thermoelectric conversion material of this embodiment includes a mother phase constituted by an SnSe-based material and an additive element of one kind or more selected from the group consisting of Sc, Ti, and Zr, for example. With this, a sharp band small in half bandwidth formed of the additive element can be formed within the forbidden band of the base material.

Figure 21:
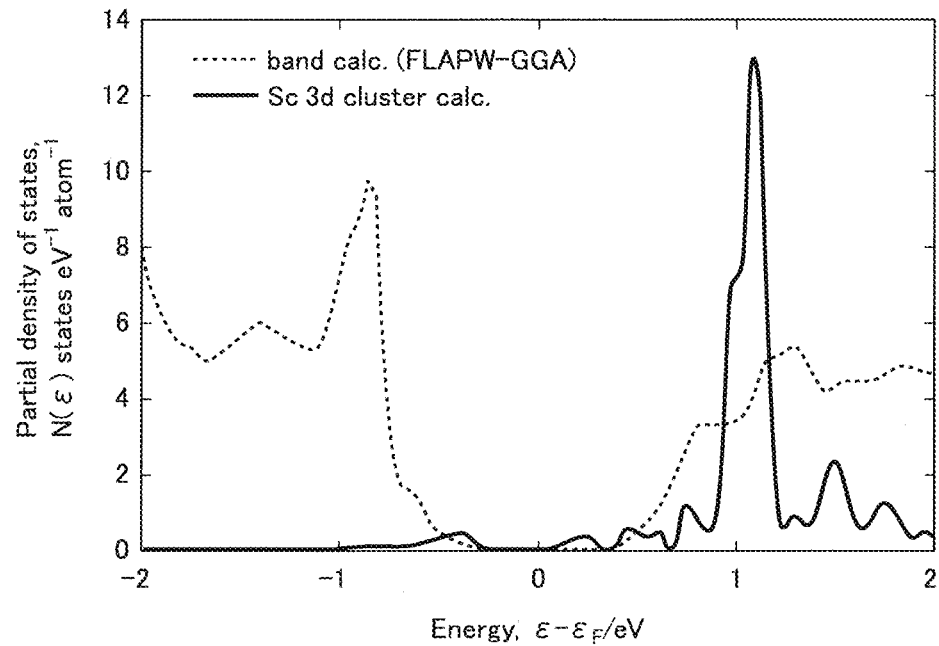
FIG. 21 is a view showing an example of the band structure in the case where an additional band of Sc as the additive element is present within the forbidden band of SnSe band in an SnSe-based material.
Figure 22:
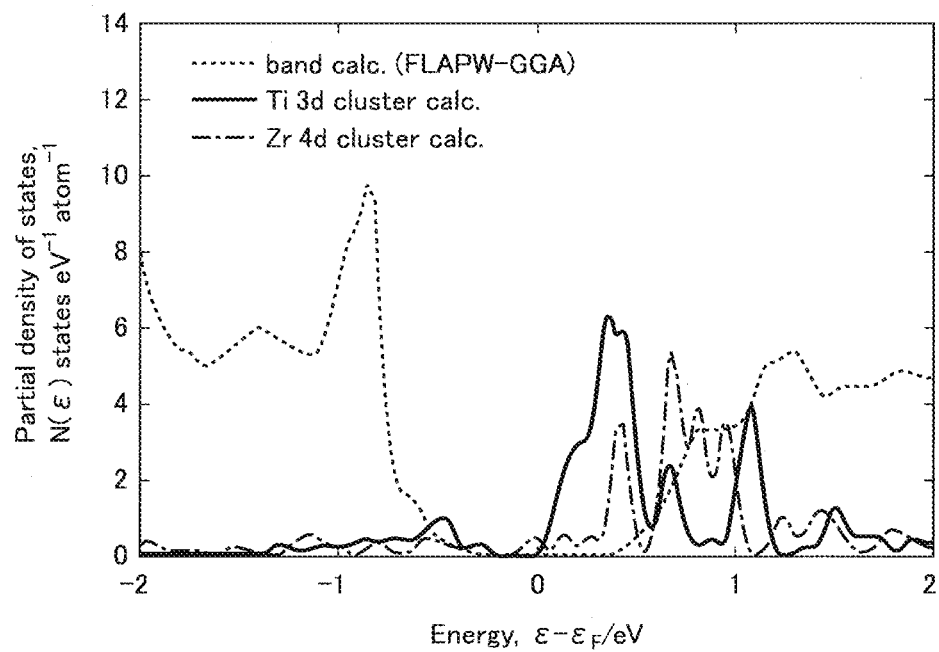
FIG. 22 is a view showing an example of the band structure in the case where an additional band of Ti or Zr as the additive element is present within the forbidden band of SnSe band in an SnSe-based material.

As for $Sn_1Se_1$ as the SnSe-based material, FIG. 21 shows an example of the band structure in the case where an additional band of Sc as the additive element is present within the forbidden band of $Sn_1Se_1$ band, and FIG. 22 shows an example of the band structure in the case where an additional band of Ti or Zr as the additive element is present within the forbidden band of $Sn_1Se_1$ band. As shown in FIGS. 21 and 22, Sc, Ti, and Zr as the additive elements can form sharp bands small in half bandwidth within the forbidden band of $Sn_1Se_1$ band. Also, by using a mother phase constituted by an SnSe-based material, an addition band narrow in half bandwidth can be formed at an end of the forbidden band of the SnSe-based material.

Note that, in FIGS. 21 to 22, the $Sn_1Se_1$ band is calculated by the FLAPW method and the GGA method described above. The bands of the 3d orbital of Sc, the 3d orbital of Ti, and the 4d orbital of Zr are cluster-calculated.

(Thermoelectric Conversion Material Having CuSe-Based Material as Base Material)

In this embodiment, a CuSe-based material can be used as the base material. The CuSe-based material as used herein refers to a material of $Cu_xSe_y$ ($0 < x$, $0 < y$, and $1/4 \leq y/x \leq 1$) and a material in which part of at least one of Cu and Se of $Cu_xSe_y$ has been replaced with Sc, Ti, vanadium (V), etc. In this case, as the additive element, it is possible to use one kind or more selected from the group consisting of Sc, Ti, and V. Specifically, the thermoelectric conversion material of this embodiment includes a mother phase constituted by a CuSe-based material and an additive element of one kind or more selected from the group consisting of Sc, Ti, and V, for example. With this, a sharp band small in half bandwidth formed of the additive element can be formed within the forbidden band of the base material.

Figure 23:
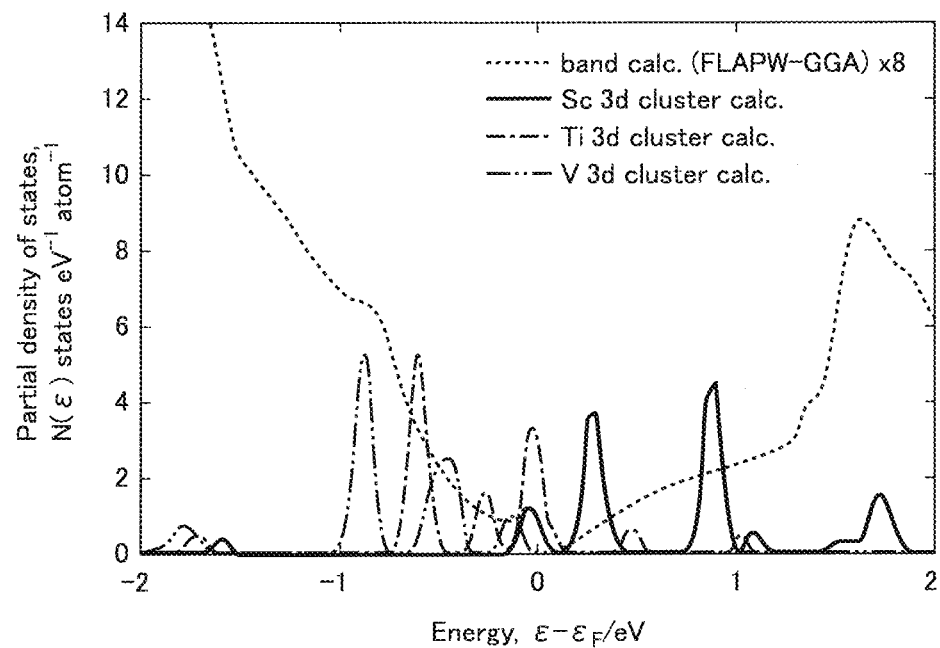
FIG. 23 is a view showing an example of the band structure in the case where an additional band of Sc, Ti, or V as the additive element is present within the forbidden band of $Cu_2Se$ band in a CuSe-based material.

As for $Cu_2Se_1$ as the CuSe-based material, FIG. 23 shows an example of the band structure in the case where an additional band of Sc, Ti, or V as the additive element is present within the forbidden band of $Cu_2Se_1$ band. As shown in FIG. 23, Sc, Ti, and V as the additive elements can form sharp bands small in half bandwidth within the forbidden band of $Cu_2Se_1$ band. Also, by using a mother phase constituted by a CuSe-based material, an addition band narrow in half bandwidth can be formed at an end of the forbidden band of the CuSe-based material.

Note that, in FIG. 23, the $Cu_2Se_1$ band is calculated by the FLAPW method and the GGA method described above. The bands of the 3d orbital of Sc, the 3d orbital of Ti, and the 3d orbital of V are cluster-calculated. The "×8" in the note for the $Cu_2Se_1$ band in FIG. 23 indicates that the represented signal has been "octupled."

Embodiment 2

Next, as an embodiment of the thermoelectric conversion element and thermoelectric conversion module using the thermoelectric conversion material according to the present invention, a power generation element and a power generation module will be described.

Figure 24:
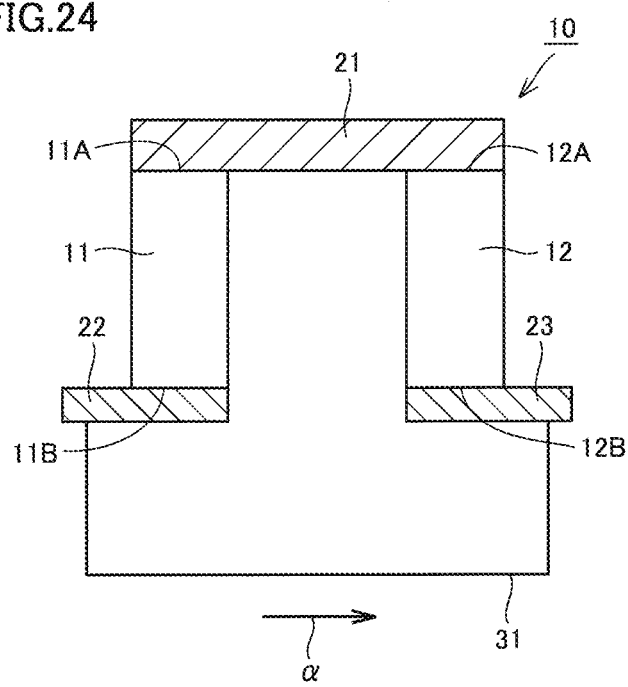
FIG. 24 is a schematic view showing an example of the structure of a power generation element.

FIG. 24 is a schematic view showing a structure of a π-shaped thermoelectric conversion element (power generation element) 10 as the thermoelectric conversion element of this embodiment. Referring to FIG. 24, π-shaped thermoelectric conversion element 10 includes a p-type thermoelectric conversion material section 11 as a first thermoelectric conversion material section, an n-type thermoelectric conversion material section 12 as a second thermoelectric conversion material section, a high-temperature side electrode 21, a first low-temperature side electrode 22, a second low-temperature side electrode 23, and an interconnection 31.

P-type thermoelectric conversion material section 11 is made of the thermoelectric conversion material of Embodiment 1 of which the ingredient composition has been adjusted to have p-type conductivity. P-type thermoelectric conversion material section 11 is made to have p-type conductivity by doping the thermoelectric conversion material of Embodiment 1 constituting p-type thermoelectric conversion material section 11 with p-type impurities that cause generation of p-type carriers (holes) as majority carriers, for example.

N-type thermoelectric conversion material section 12 is made of the thermoelectric conversion material of Embodiment 1 of which the ingredient composition has been adjusted to have n-type conductivity. N-type thermoelectric conversion material section 12 is made to have n-type conductivity by doping the thermoelectric conversion material of Embodiment 1 constituting n-type thermoelectric conversion material section 12 with n-type impurities that cause generation of n-type carriers (electrons) as majority carriers, for example.

P-type thermoelectric conversion material section 11 and n-type thermoelectric conversion material section 12 are placed side by side with a spacing therebetween. High-temperature side electrode 21 is placed to extend from one end 11A of p-type thermoelectric conversion material section 11 to one end 12A of n-type thermoelectric conversion material section 12. High-temperature side electrode 21 is placed to be in contact with both end 11A of p-type thermoelectric conversion material section 11 and end 12A of n-type thermoelectric conversion material section 12. High-temperature side electrode 21 is placed to connect end 11A of p-type thermoelectric conversion material section 11 and end 12A of n-type thermoelectric conversion material section 12. High-temperature side electrode 21 is made of a conductive material, e.g., a metal. High-temperature side electrode 21 is in ohmic contact with p-type thermoelectric conversion material section 11 and n-type thermoelectric conversion material section 12.

First low-temperature side electrode 22 is placed to be in contact with the other end 11B of p-type thermoelectric conversion material section 11. First low-temperature side electrode 22 is placed apart from high-temperature side electrode 21. First low-temperature side electrode 22 is made of a conductive material, e.g., a metal. First low-temperature side electrode 22 is in ohmic contact with p-type thermoelectric conversion material section 11.

Second low-temperature side electrode 23 is placed to be in contact with the other end 12B of n-type thermoelectric conversion material section 12. Second low-temperature side electrode 23 is placed apart from high-temperature side electrode 21 and first low-temperature side electrode 22. Second low-temperature side electrode 23 is made of a conductive material, e.g., a metal. Second low-temperature side electrode 23 is in ohmic contact with n-type thermoelectric conversion material section 12.

Interconnection 31 is made of a conductor such as a metal. Interconnection 31 electrically connects first low-temperature side electrode 22 and second low-temperature side electrode 23.

In π-shaped thermoelectric conversion element 10, when a temperature difference is formed so that the temperature is high on the end 11A side of p-type thermoelectric conversion material section 11 and the end 12A side of n-type thermoelectric conversion material section 12 and is low on the end 11B side of p-type thermoelectric conversion material section 11 and the end 12B side of n-type thermoelectric conversion material section 12, for example, p-type carriers (holes) migrate from the end 11A side toward the end 11B side in p-type thermoelectric conversion material section 11. At this time, in n-type thermoelectric conversion material section 12, n-type carriers (electrons) migrate from the end 12A side toward the end 12B side. As a result, in interconnection 31, a current flows in the direction of arrow α. In this way, in π-shaped thermoelectric conversion element 10, electric power generation by thermoelectric conversion using the temperature difference is achieved. That is, π-shaped thermoelectric conversion element 10 is a power generation element.

As the material constituting p-type thermoelectric conversion material section 11 and n-type thermoelectric conversion material section 12, used is the thermoelectric conversion material of Embodiment 1 with a value of ZT having increased by raising the electric conductivity. As a result, π-shaped thermoelectric conversion element 10 is a highly efficient power generation element.

Moreover, by electrically connecting a plurality of π-shaped thermoelectric conversion elements 10 with each other, a power generation module as the thermoelectric conversion module can be obtained. A power generation module 50 as the thermoelectric conversion module of this embodiment has a structure of a plurality of π-shaped thermoelectric conversion elements 10 connected in series.

Figure 25:
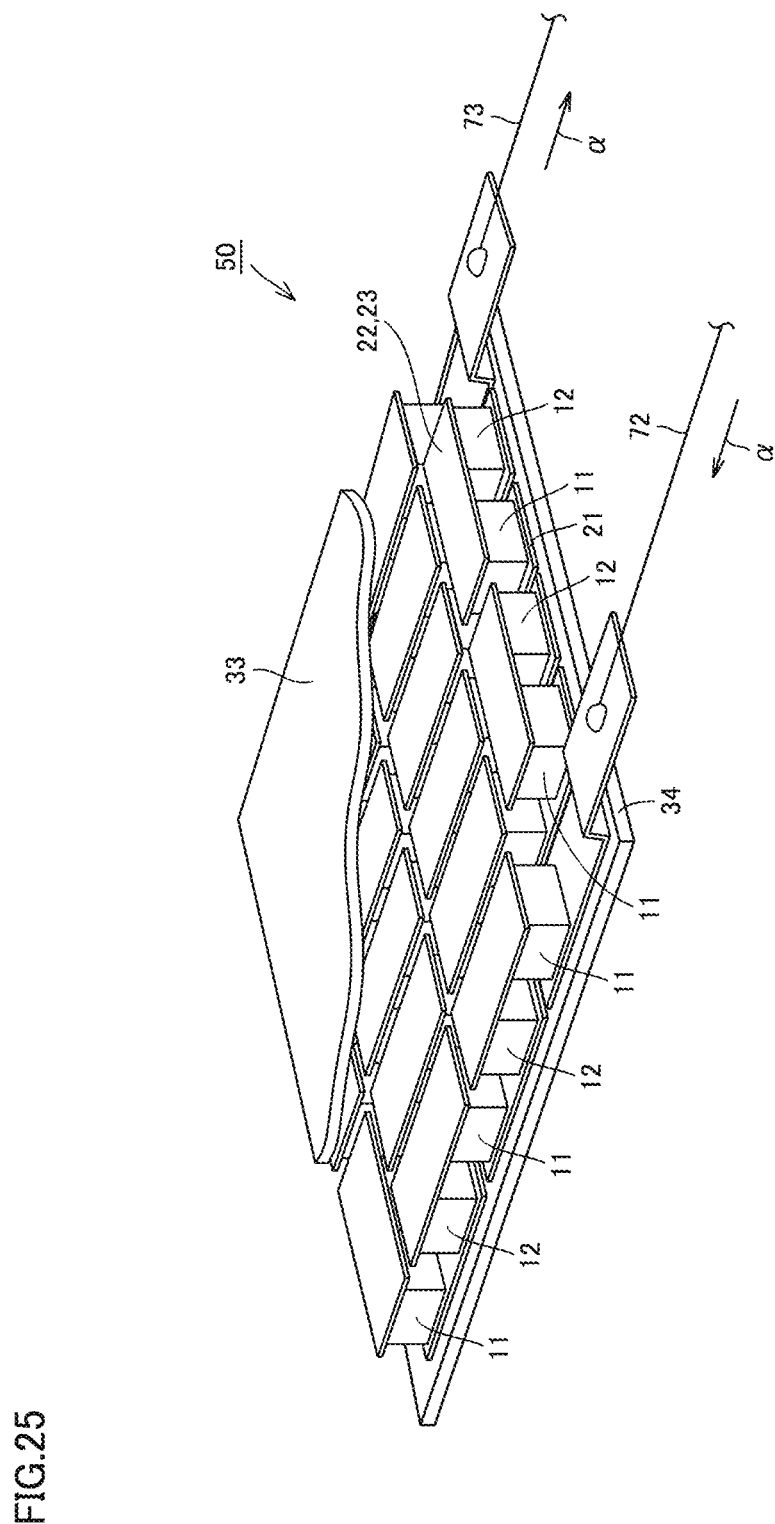
FIG. 25 is a schematic view showing an example of the structure of a power generation module.

Referring to FIG. 25, power generation module 50 of this embodiment includes p-type thermoelectric conversion material sections 11, n-type thermoelectric conversion material sections 12, low-temperature side electrodes 22, 23 corresponding to first low-temperature side electrodes 22 and second low-temperature side electrodes 23, high-temperature side electrodes 21, a low-temperature side insulator substrate 33, and a high-temperature side insulator substrate 34. Low-temperature side insulator substrate 33 and high-temperature side insulator substrate 34 are made of a ceramic such as alumina. P-type thermoelectric conversion material sections 11 and n-type thermoelectric conversion material sections 12 are arranged alternately. Low-temperature side electrodes 22, 23 are placed in contact with p-type thermoelectric conversion material sections 11 and n-type thermoelectric conversion material sections 12, as in π-shaped thermoelectric conversion element 10 described above. High-temperature side electrodes 21 are placed in contact with p-type thermoelectric conversion material sections 11 and n-type thermoelectric conversion material sections 12, as in π-shaped thermoelectric conversion element 10 described above. Each of p-type thermoelectric conversion material sections 11 is connected to n-type thermoelectric conversion material section 12 adjacent on one side via common high-temperature side electrode 21. Also, this p-type thermoelectric conversion material section 11 is connected to n-type thermoelectric conversion material section 12 adjacent on the other side via common low-temperature side electrode 22, 23. In this way, all p-type thermoelectric conversion material sections 11 and n-type thermoelectric conversion material sections 12 are connected in series.

Low-temperature side insulator substrate 33 is placed on the principal plane side of plate-shaped low-temperature side electrodes 22, 23 opposite to the side in contact with p-type thermoelectric conversion material sections 11 and n-type thermoelectric conversion material sections 12. One low-temperature side insulator substrate 33 is placed for the plurality of (all) low-temperature side electrodes 22, 23. High-temperature side insulator substrate 34 is placed on the side of plate-shaped high-temperature side electrodes 21 opposite to the side in contact with p-type thermoelectric conversion material sections 11 and n-type thermoelectric conversion material sections 12. One high-temperature side insulator substrate 34 is placed for the plurality of (all) high-temperature side electrodes 21.

Interconnections 72 and 73 are connected to high-temperature side electrodes 21 or low-temperature side electrodes 22, 23 that are in contact with p-type thermoelectric conversion material sections 11 or n-type thermoelectric conversion material sections 12 located at both ends of serially-connected p-type thermoelectric conversion material sections 11 and n-type thermoelectric conversion material sections 12. When a temperature difference is formed so that the temperature is high on the high-temperature side insulator substrate 34 side and is low on the low-temperature side insulator substrate 33 side, a current in the direction of arrow α flows by serially-connected p-type thermoelectric conversion material sections 11 and n-type thermoelectric conversion material sections 12, as in the case of π-shaped thermoelectric conversion element 10. In this way, in power generation module 50, power generation by thermoelectric conversion using the temperature difference is achieved.

Embodiment 3

Next, as another embodiment of the thermoelectric conversion element using the thermoelectric conversion material according to the present invention, an infrared sensor that is an optical sensor will be described.

Figure 26:
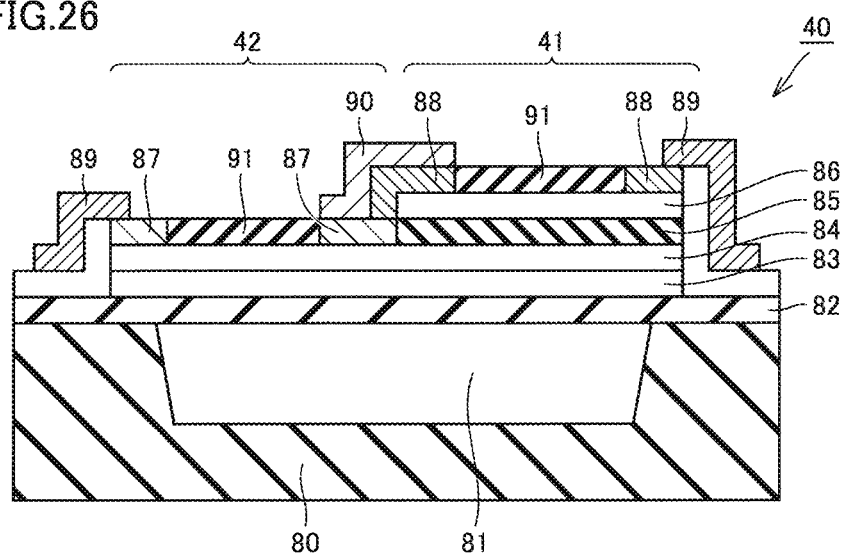
FIG. 26 is a view showing an example of the structure of an infrared sensor.

FIG. 26 is a schematic cross-sectional view showing the structure of an infrared sensor 40 that is the thermoelectric conversion element of this embodiment. Referring to FIG. 26, infrared sensor 40 includes a p-type thermoelectric conversion section 41 and an n-type thermoelectric conversion section 42 placed adjacent to each other. P-type thermoelectric conversion section 41 and n-type thermoelectric conversion section 42 are formed on a substrate 80.

Infrared sensor 40 includes a substrate 80, an etching stop layer 82, an n-type thermoelectric conversion material layer 83, an $n^+$-type ohmic contact layer 84, an insulator layer 85, a p-type thermoelectric conversion material layer 86, n-side ohmic contact electrodes 87, p-side ohmic contact electrodes 88, a heat absorption pad 89, an absorber 90, and a protection film 91.

Substrate 80 is made of an insulator such as silicon dioxide. A concave portion 81 is formed on substrate 80. Etching stop layer 82 is formed to cover the surface of substrate 80. Etching stop layer 82 is made of an insulator such as silicon nitride, for example. A gap is formed between etching stop layer 82 and concave portion 81 of substrate 80.

N-type thermoelectric conversion material layer 83 is formed on the principal surface of etching stop layer 82 opposite to the surface on which substrate 80 is formed. N-type thermoelectric conversion material layer 83 is made of the thermoelectric conversion material of Embodiment 1 of which the ingredient composition has been adjusted to have n-type conductivity, for example. The thermoelectric conversion material of Embodiment 1 constituting n-type thermoelectric conversion material layer 83 is doped with n-type impurities that cause generation of n-type carriers (electrons) as majority carriers, for example, whereby n-type thermoelectric conversion material layer 83 has n-type conductivity. $N^+$-type ohmic contact layer 84 is formed on the principal surface of n-type thermoelectric conversion material layer 83 opposite to the surface on which etching stop layer 82 is formed. $N^+$-type ohmic contact layer 84 is doped with n-type impurities that cause generation of n-type carriers (electrons) as majority carriers, for example, at a higher concentration than n-type thermoelectric conversion material layer 83, whereby $n^+$-type ohmic contact layer 84 has n-type conductivity.

One of n-side ohmic contact electrodes 87 is placed so as to be in contact with a center portion of the principal surface of $n^+$-type ohmic contact layer 84 opposite to the surface on which n-type thermoelectric conversion material layer 83 is formed. N-side ohmic contact electrode 87 is made of a material capable of ohmic contacting with $n^+$-type ohmic contact layer 84, e.g., a metal. Insulator layer 85 made of an insulator such as silicon dioxide, for example, is placed on the principal surface of $n^+$-type ohmic contact layer 84 opposite to the surface on which n-type thermoelectric conversion material layer 83 is formed. Insulator layer 85 is placed on a portion of the principal surface of $n^+$-type ohmic contact layer 84 on the p-type thermoelectric conversion section 41 side with respect to n-side ohmic contact electrode 87.

Protection film 91 is further placed on the principal surface of $n^+$-type ohmic contact layer 84 opposite to the surface on which n-type thermoelectric conversion material layer 83 is formed. Protection film 91 is placed on a portion of the principal surface of $n^+$-type ohmic contact layer 84 on the opposite side from p-type thermoelectric conversion section 41 with respect to n-side ohmic contact electrode 87. The other n-side ohmic contact electrode 87 is placed on a portion of the principal surface of $n^+$-type ohmic contact layer 84 opposite to the surface on which n-type thermoelectric conversion material layer 83 is formed so as to oppose the former n-side ohmic contact electrode 87 with protection film 91 interposed therebetween.

P-type thermoelectric conversion material layer 86 is placed on the principal surface of insulator layer 85 opposite to the surface on which $n^+$-type ohmic contact layer 84 is formed. P-type thermoelectric conversion material layer 86 is made of the thermoelectric conversion material of Embodiment 1 of which the ingredient composition has been adjusted to have p-type conductivity, for example. The thermoelectric conversion material of Embodiment 1 constituting p-type thermoelectric conversion material layer 86 is doped with p-type impurities that cause generation of p-type carriers (holes) as majority carriers, for example, whereby p-type thermoelectric conversion material layer 86 has p-type conductivity.

Protection film 91 is also placed on a center portion of the principal surface of p-type thermoelectric conversion material layer 86 opposite to the surface on which insulator layer 85 is formed. A pair of p-side ohmic contact electrodes 88 are placed on the principal surface of p-type thermoelectric conversion material layer 86 opposite to the surface on which insulator layer 85 is formed with protection film 91 interposed therebetween. P-side ohmic contact electrodes 88 are made of a material capable of ohmic contacting with p-type thermoelectric conversion material layer 86, e.g., a metal. One of paired p-side ohmic contact electrodes 88 closer to n-type thermoelectric conversion section 42 is connected to n-side ohmic contact electrode 87.

Absorber 90 is placed to cover the principal surfaces of p-side ohmic contact electrode 88 and n-side ohmic contact electrode 87 connected to each other opposite to the surfaces where $n^+$-type ohmic contact layer 84 is formed. Absorber 90 is made of titanium, for example. Heat absorption pad 89 is placed to be in contact with the top surface of other p-side ohmic contact electrode 88 that is not connected to n-side ohmic contact electrode 87. Heat absorption pad 89 is also placed to be in contact with the top surface of other n-side ohmic contact electrode 87 that is not connected to p-side ohmic contact electrode 88. Gold (Au)/titanium (Ti), for example, is used as the material of heat absorption pad 89.

When infrared sensor 40 is irradiated with infrared light, absorber 90 absorbs energy of the infrared light. As a result, while the temperature of absorber 90 rises, temperature rise of heat absorption pads 89 is prevented. This causes a temperature difference between absorber 90 and heat absorption pads 89. With this, in p-type thermoelectric conversion material layer 86, p-type carriers (holes) migrate from the absorber 90 side toward the heat absorption pad 89 side. Likewise, in n-type thermoelectric conversion material layer 83, n-type carriers (electrons) migrate from the absorber 90 side toward the heat absorption pad 89 sides. By taking out a current flowing as a result of the migration of carriers from n-side ohmic contact electrodes 87 and p-side ohmic contact electrodes 88, infrared light is detected.

In infrared sensor 40 of this embodiment, as the material constituting p-type thermoelectric conversion material layer 86 and n-type thermoelectric conversion material layer 83, used is the thermoelectric conversion material of Embodiment 1 with a value of ZT having increased by raising the electric conductivity. As a result, infrared sensor 40 is a highly sensitive infrared sensor.

It should be understood that the embodiments disclosed herein are illustrative in all aspects and are not restrictive by any means. It is intended that the scope of the present invention shall be defined, not by the above description, but by the appended claims, and cover all changes falling within the spirit and scope equivalent to the appended claims.

INDUSTRIAL APPLICABILITY

The thermoelectric conversion material, the thermoelectric conversion element, and the thermoelectric conversion module in this application are especially favorably applicable to a thermoelectric conversion material, a thermoelectric conversion element, and a thermoelectric conversion module that are required to improve conversion efficiency.

REFERENCE SIGNS LIST

1: valence band, 2: conduction band, 3: forbidden band, 4: additional band, 10: π-shaped thermoelectric conversion element, 11: p-type thermoelectric conversion material section, 11A, 11B: end, 12: n-type thermoelectric conversion material section, 12A, 12B: end, 21: high-temperature side electrode, 22: first low-temperature side electrode (low-temperature side electrode), 23: second low-temperature side electrode (low-temperature side electrode), 31: interconnection, 33: low-temperature side insulator substrate, 34: high-temperature side insulator substrate, 40: infrared sensor, 41: p-type thermoelectric conversion section, 42: n-type thermoelectric conversion section, 50: power generation module, 72, 73: interconnection, 80: substrate, 81: concave portion, 82: etching stop layer, 83: n-type thermoelectric conversion material layer, 84: $n^+$-type ohmic contact layer, 85: insulator layer, 86: p-type thermoelectric conversion material layer, 87: n-side ohmic contact electrode, 88: p-side ohmic contact electrode, 89: heat absorption pad, 90: absorber, 91: protection film

The invention claimed is:
1. A thermoelectric conversion material, comprising:
a base material that is a semiconductor; and
an additive element that differs from an element constituting the base material,
wherein
an additional band formed of the additive element is present within a forbidden band of the base material,
a density of states of the additional band has a ratio of greater than or equal to 0.1 relative to a maximum value of a density of states of a valence band adjacent to the forbidden band of the base material,
a half bandwidth of the additional band is less than or equal to 50 meV,
a crystalline body precipitated out of a mother phase composed of the base material has a grain size of 3 to 15 nm, and
an aggregate of the additive element has a grain size of 3 to 15 nm.
2. The thermoelectric conversion material according to claim 1, wherein an electric conductivity is greater than or equal to 50 kS/m and less than or equal to 1.5 MS/m.
3. The thermoelectric conversion material according to claim 1, wherein the additive element has an unoccupied orbital in d orbital or f orbital located inside an outermost shell.
4. The thermoelectric conversion material according to claim 1, wherein the additive element is a transition metal.
5. The thermoelectric conversion material according to claim 1, wherein the additional band lies in a region within 100 meV from the valence band or a conduction band of the base material.
6. The thermoelectric conversion material according to claim 1, wherein the base material is a SiGe-based material.
7. The thermoelectric conversion material according to claim 6, wherein the additive element is one kind or more selected from the group consisting of Au, Cu, Ni, and Fe.
8. The thermoelectric conversion material according to claim 1, wherein the base material is a MnSi-based material.

9. The thermoelectric conversion material according to claim 8, wherein the additive element is one kind or more selected from the group consisting of Ru, Ta, W, and Re.

10. The thermoelectric conversion material according to claim 8, wherein the base material is an AlMnSi-based material in which a part of at least one of Mn and Si of the MnSi-based material has been replaced with Al.

11. The thermoelectric conversion material according to claim 10, wherein the additive element is one kind or more selected from the group consisting of Ru, Ta, W, and Re.

12. The thermoelectric conversion material according to claim 1, wherein the base material is a SnSe-based material.

13. The thermoelectric conversion material according to claim 12, wherein the additive element is one kind or more selected from the group consisting of Sc, Ti, and Zr.

14. The thermoelectric conversion material according to claim 1, wherein the base material is a CuSe-based material.

15. The thermoelectric conversion material according to claim 14, wherein the additive element is one kind or more selected from the group consisting of Sc, Ti, and V.

* * * * *